US 6,569,784 B1

(12) United States Patent
Wang et al.

(10) Patent No.: US 6,569,784 B1
(45) Date of Patent: May 27, 2003

(54) MATERIAL OF PHOTORESIST PROTECT OXIDE

(75) Inventors: Ling Sung Wang, Hsinchu (TW); Ping Chun Wei, Taipei (TW); Chih Jen Wu, Hsin Chu (TW); Yu Ping Chang, Taipei (TW); Su Ching Yuan, Hsinchu (TW); Jyh-Terng Shih, Lujou (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/908,823

(22) Filed: Jul. 20, 2001

(51) Int. Cl.$^7$ .................. H01L 21/31; H01L 21/469
(52) U.S. Cl. .................. 438/787; 438/199; 438/778
(58) Field of Search ................. 438/199, 778, 438/787

(56) References Cited

U.S. PATENT DOCUMENTS

| | | | |
|---|---|---|---|
| 5,374,847 A | * 12/1994 | Araki et al. | |
| 5,576,102 A | * 11/1996 | Kisaka et al. | |
| 5,744,378 A | * 4/1998 | Homma | |
| 6,162,722 A | 12/2000 | Hsu | 438/637 |
| 6,174,590 B1 | 1/2001 | Iyer et al. | 428/209 |
| 6,187,655 B1 | 2/2001 | Wang et al. | 438/528 |
| 6,194,258 B1 | 2/2001 | Wuu | 438/200 |
| 6,207,492 B1 | 3/2001 | Tzeng et al. | 438/241 |

FOREIGN PATENT DOCUMENTS

JP          404111425      * 4/1992

* cited by examiner

Primary Examiner—Long Pham
(74) Attorney, Agent, or Firm—George O. Saile; Stephen B. Ackerman

(57) ABSTRACT

A new layer of RPO is provided for semiconductor devices, specifically for semiconductor device having sub-micron device feature size. The layer of RPO that is provided by the invention comprises a layer of silicon-rich CVD oxide, having a refractive index of between about 1.57 and 1.60 to prevent silicon atoms that are present in a layer of polysilicon from diffusing into the overlying layer of resist protect oxide.

19 Claims, 3 Drawing Sheets

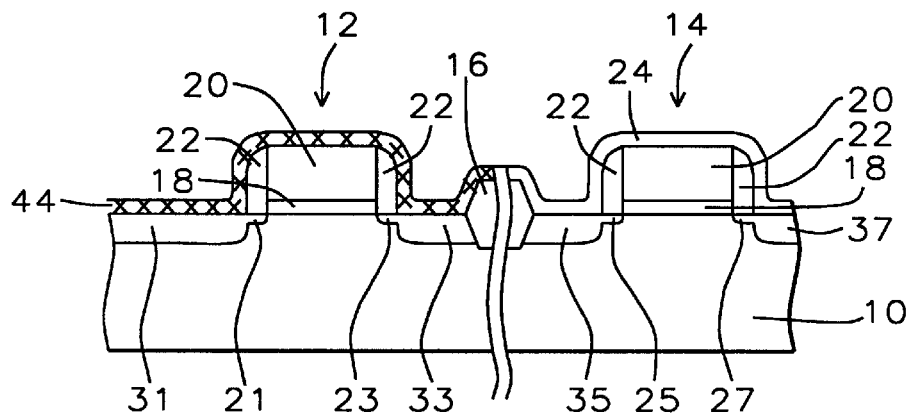
FIG. 5
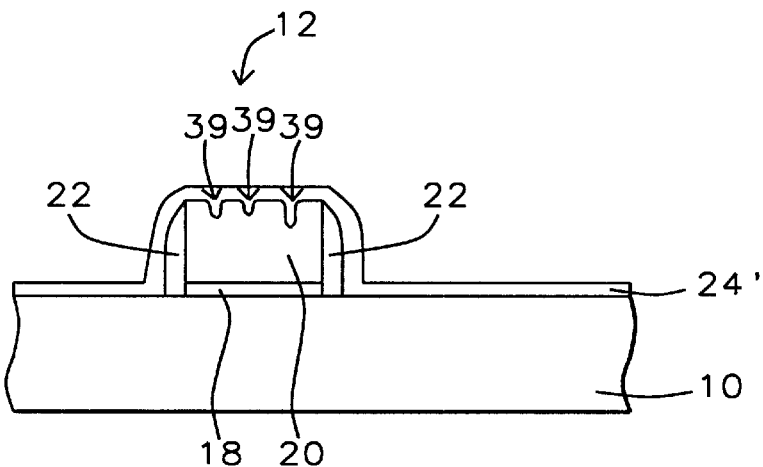
FIG. 6 – Prior Art
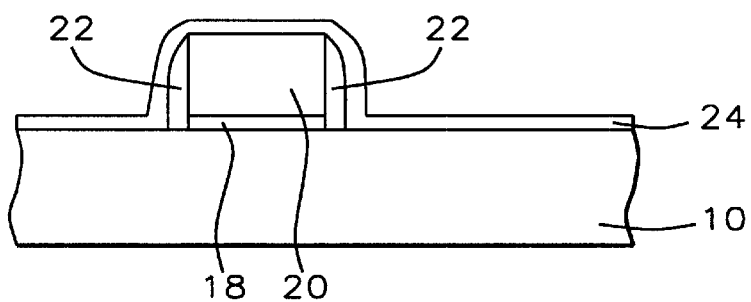
FIG. 7

US 6,569,784 B1

MATERIAL OF PHOTORESIST PROTECT OXIDE

BACKGROUND OF THE INVENTION (1) Field of the Invention

The invention relates to the fabrication of integrated circuit devices, and more particularly, to a method of providing a coating of Photoresist Protect Oxide (RPO) such that the occurrence of polysilicon void defects is eliminated.

(2) Description of the Prior Art

The creation of CMOS devices is well known and well established in the art. Continued miniaturization of device features, in order to gain improved device performance at a competitive cost, leads to continued reduction in device feature size and with that a continued reduction in the thickness of the various layers of semiconductor material that are used in the creation of a semiconductor device.

During the formation of CMOS devices over the surface of a substrate, devices of different polarities, such as CMOS and NMOS devices, can be created overlying the surface of one substrate and as part of a continuing processing stream. Also, some of these different devices may be processed following a different processing stream, for instance some of the devices may by provided with salicided, low resistivity points of contact to the gate electrodes of the CMOS devices while other devices that are also created over the surface of the same substrate are not processed with salicided points of electrical contact to the CMOS devices. For this reason, that is the difference in processing steps for CMOS devices that are created over the surface of one substrate, some of these devices are coated with a layer of (photo) Resistance Protective Oxide (RPO).

As an example of the difference in processing of CMOS devices that are created over the surface of one substrate can be cited the creation of self-aligned contact points to the source/drain regions and the gate electrode of a CMOS device. By universally covering all CMOS devices that are created over the surface of the substrate with a layer of RPO after the gate structures, including the gate spacers, have been created, the devices can be divided into devices that need to be provided with salicided points of electrical contact and those that do not. By then covering the devices that do not need to be provided with salicided points of contact with a patterned layer of photoresist that covers these devices, the layer of RPO can be removed from the devices which need to be provided with salicide points of electrical contact, thus exposing the surfaces that need to be salicided and enabling the completion of the salicidation for the devices that are not covered by a layer of photoresist.

With the continuing decrease in device feature size, the thickness of this layer of RPO also needs to be further decreased, which places increased demands on the quality of the layer of RPO that is deposited. The quality of the layer of RPO is typically evaluated using parameters such as Field-to-Breakdown ($V_{bd}$) and Charge-to-Breakdown ($Q_{bd}$). One of the problems that is encountered in the era of sub-micron device feature size is the occurrence of voids in the interface between the layer of RPO and the layer of polysilicon that is used for the creation of the gate structure. It is critical that the occurrence of such voids is prevented, the invention provides such a method by controlling the quality of the layer of RPO that is used.

U.S. Pat. No. 6,207,492 (Tzeng et al.) shows a RPO layer.

U.S. Pat. No. 6,174,590 (Iyer et al.) and U.S. Pat. No. 6,162,722 (Hsu) shows silicon rich oxide ARC layers.

U.S. Pat. No. 6,194,258 (Wuu) and U.S. Pat. No. 6,187,655 (Wang) are related patents.

SUMMARY OF THE INVENTION

A principle objective of the invention is to provide a method that prevents the formation of voids in the interface between a layer of Resist Protect Oxide (RPO) and an underlying layer of polysilicon that functions as a layer of a gate structure.

In accordance with the invention, a new layer of RPO is provided for semiconductor devices, specifically for semiconductor devices having sub-micron device feature size. The layer of RPO that is provided by the invention comprises a layer of silicon-rich CVD oxide, having a refractive index of between about 1.57 and 1.60, to prevent silicon atoms that are present in a layer of polysilicon from diffusing into the overlying layer of resist protect oxide.

BRIEF DESCRIPTION OF THE DRAWINGS

FIG. 5 shows a cross section after the deposited layer of cobalt has been annealed, the photoresist mask has been removed.

FIG. 6 shows the formation of voids on the surface of a layer of polysilicon, using a conventional layer of silicon oxide as the layer of RPO.

FIG. 7 shows the absence of voids on the surface of a layer of polysilicon, using the layer of the invention of silicon rich CVD oxide as the layer of RPO.

DESCRIPTION OF THE PREFERRED EMBODIMENTS

Figure 1:
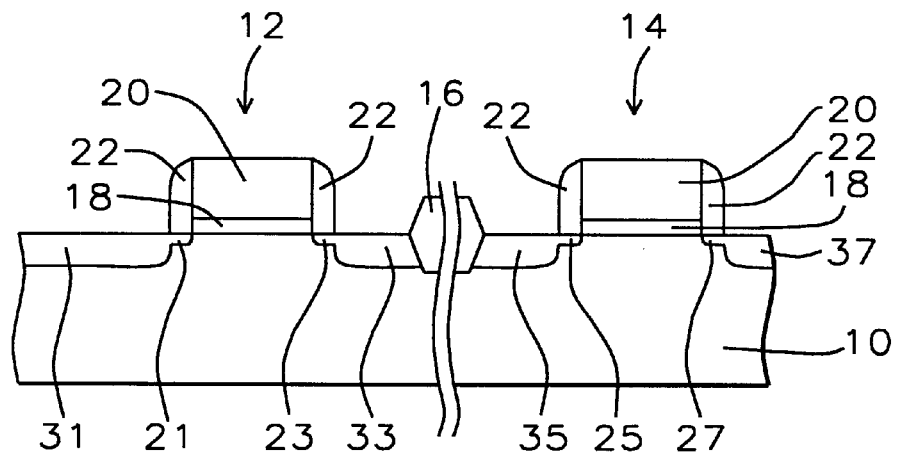
FIG. 1 shows a cross section of the surface of a substrate over which two gate structures have been created, the two gate structures are divided into separate groups.

Referring now specifically to the cross section that is shown in FIG. 1, there are highlighted the following elements of the structures:

10, the surface of a semiconductor substrate 12 and 14, two gate electrodes that have been created over the surface of substrate 10

16, a region of insulation, such as a region of Field Oxide or a Shallow Trench Isolation region, that has been created between the two gate structures 12 and 14 in order to electrically isolate gate structures 12 and 14 from each other 18, a layer of gate oxide that has been created over the surface of substrate 10, deposited using methods of LPCVD or CVD or PECVD or by exposing the surface of substrate 10 to an oxidizing environment; layer 18 of gate oxide is preferably created to a thickness between about 300 and 500 Angstrom and more preferably to a thickness of about 400 Angstrom 20, the gate electrode of gate structures 12 and 14, gate electrode 20 preferably comprises polysilicon and is, after blanket deposition over the surface of a layer 18 of gate oxide, etched together with layer 18 of gate oxide to form the gate structures that are shown in cross section in FIG. 1

22, gate spacers that are formed over the sidewalls of the gate structures 18/20

21, 23 LDD impurity implants into the surface of substrate 10 self-aligned with gate electrode 12

25, 27 LDD impurity implants into the surface of substrate 10 self-aligned with gate electrode 14

31, 33 source/drain impurity implants into the surface of substrate 10 self-aligned with gate electrode 12, and 35, 37 source/drain impurity implants into the surface of substrate 10 self-aligned with gate electrode 14.

Figure 2:
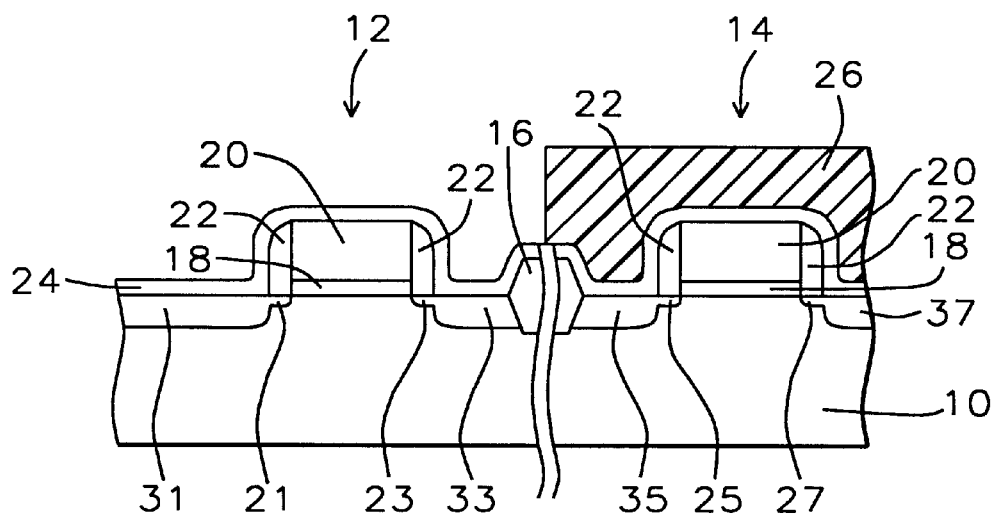
FIG. 2 shows a cross section of the two gate structures of FIG. 1 after the layer of RPO of the invention has been deposited over the two gate structures, the two gate structures have been patterned for separate processing.

FIG. 2 shows a cross section of the two gate electrodes 12 and 14 that have been shown in FIG. 1, added to the cross section that is shown in FIG. 2 are:

24, a layer of RPO, deposited over the surface of the gate electrodes 12 and 14 and the exposed surface of substrate 10 as a means to protect these surfaces during subsequent processing, and 26, a patterned and developed layer of photoresist, forming a photoresist mask 26 over the surface of layer 24 of RTO. A layer of photoresist can be etched, for the formation of photoresist mask 26, by applying $O_2$ plasma and then wet stripping by using a $H_2SO_4$, $H_2O_2$ and $NH_4OH$ solution.

Layer 24 of RPO can be deposited using methods of LPCVD or CVD or PECVD, layer 24 of RPO is preferably created using methods of PECVD (in view of the lower processing temperatures that are required for the PECVD process), deposited to a thickness between about 300 and 500 Angstrom and more preferably to a thickness of about 400 Angstrom.

The preferred material that is used by the invention for the deposition of layer 24 is silicon-rich CVD oxide, which preferably has a refractive index of between about 1.57 and 1.60. It is known in the art that a conventional layer of silicon dioxide has a refractive index of about 1.46.

The patterned and developed layer 26 of photoresist has been shown in the cross section of FIG. 2 in order to highlight the previously cited processing approach where gate structures can be submitted to different processing steps. For instance, the layer 26 can be used to etch layer 24 of RPO, exposing regions of contact of gate structure 12 after which these contact regions can be salicided. Also, the layer 26 of photoresist protects gate structure 14. If therefore gate structure 12 is provided with impurity implants, self-aligned with gate structure 12, for the creation of LDD regions and source/drain regions for gate structure 12, then the RPO layer 24 overlying the gate structure 14 is not exposed to the impurity implant, thus avoiding damage to layer 24 of RPO where this layer overlies gate structure 14.

The invention provides for the use of a layer 24 of RPO that comprises silicon rich CVD oxide. It has been empirically determined that the occurrence of voids between the layer 24 of RPO and the underlying polysilicon 20 of gate structures 12 and 14 is eliminated if silicon rich CVD oxide is used as the material for layer 24. This phenomenon is attributable to the value of the Refractive Index (RI) of silicon rich CVD oxide, which is between about 1.57 and 1.60. This refractive index prevents the migration of silicon atoms from the underlying polysilicon 20 into the silicon rich layer 24 of CVD oxide, thus preventing the creation of voids in the layer 20 of polysilicon. It has been experimentally confirmed that the use of silicon rich CVD oxide for layer 24 of RPO allows for the reduction of device feature size, for which a correspondingly thin layer of RPO is required. The invention is preferably applicable to sub-micron CMOS devices, having channel lengths in the range of 0.18 μm or less.

To further emphasize the advantages that are provided by the invention, FIGS. 6 and 7 are used where one gate electrode is shown in cross section. In the cross section that is shown in FIG. 6, a layer 24', containing the conventional silicon oxide, has been deposited as a layer of RPO. It has been found that molecular migration occurs from the poly layer 20 of the gate electrode into the layer 24' of silicon oxide, creating voids 39 in the surface of the layer 20 of polysilicon where this layer 20 of polysilicon interfaces with the layer 24' of silicon oxide. The photomask 26, that has been provided in the cross section of FIG. 2, indicates that gate electrode 12 has been selected for addition processing, for which the layer 24' is removed from above the surface of gate electrode 12. This additional processing is most typically the process of salicidation for which a layer of cobalt is deposited over the exposed surface of gate electrode 12, including the voids that are present in the surface of gate electrode 12. This causes cobalt silicide ($CoSi_2$) to be formed inside voids 39 of gate electrode 12, which has been determined as being the leading cause of Gate Oxide Integrity (GOI) breakdown. FIG. 7 is shown to highlight that, if the layer of RPO is a silicon rich layer then voids, like voids 39 of FIG. 6, will not be formed in the interface between the poly 20 of the gate electrode 12 and the overlying layer of RPO.

Figure 3:
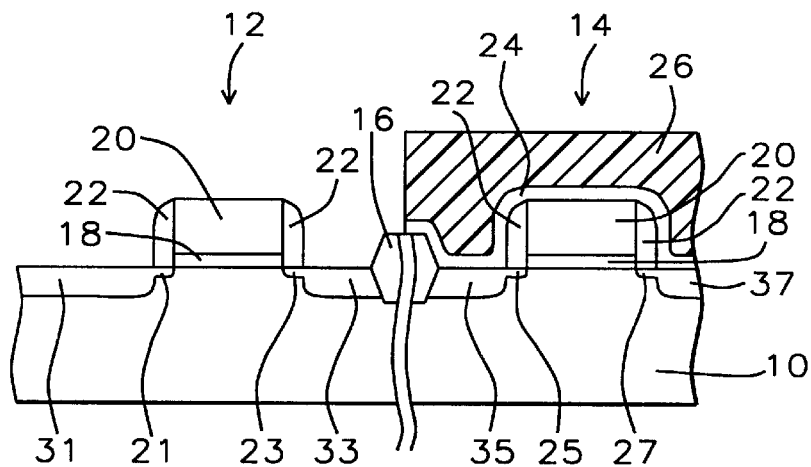
FIG. 3 shows a cross section of the two gate electrodes of FIG. 2, the layer of RPO of the invention has been etched in accordance with the photoresist mask shown in cross section in FIG. 2, exposing surfaces of a gate electrode.

FIG. 3 shows a cross section of the gate electrodes 12 and 14 after the layer 24 of silicon rich CVD oxide has been removed in accordance with the photoresist mask 26. A buffered HF wet etch process is applied for the etch of exposed layer 24, requiring contact with acid solutions at elevated temperatures. For instance, for wet etching may be used solutions of phosphoric acid, nitric acid, acetic acid at temperatures from about 30 degrees C. to about 50 degrees C.

Figure 4:
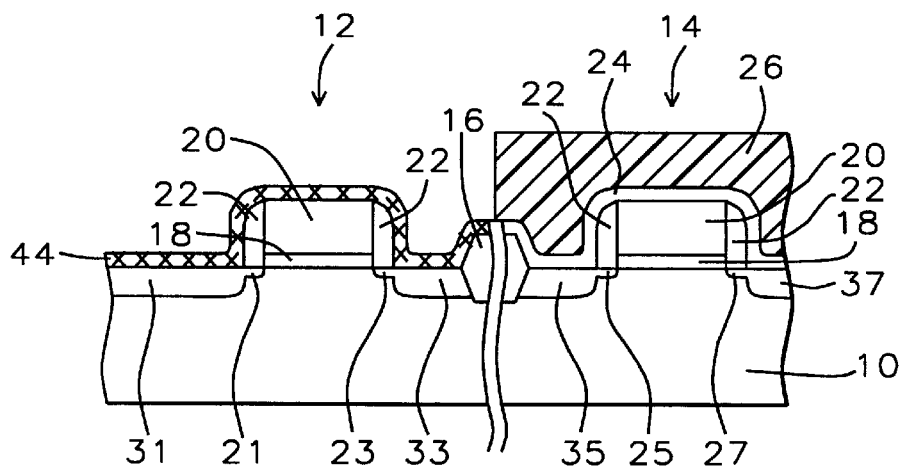
FIG. 4 shows a cross section after a layer of cobalt has been deposited over the exposed surfaces created by the previous removal of the layer of RPO.

FIG. 4 shows a cross section of the two gate electrodes 12 and 14 whereby the process of salicidation of the contact regions of gate electrode 12, that is the surfaces of the source/drain regions and the surface of the gate electrode 12, is continued. For this purpose a layer 44 of cobalt is deposited over the exposed surfaces of gate electrode 12, this layer of cobalt is annealed with the underlying surfaces forming cobalt silicide. The layer 44 of cobalt can be deposited to a thickness between about 50 to 150 Angstrom and more preferably to a thickness of about 80 Angstrom, at a temperature of 25 to 300 degrees C. using either rf. sputtering or CVD techniques. The anneal of layer 44, FIG. 4, of cobalt, which forms layer 46, FIG. 5 of $CoSi_x$, is typically performed at a temperature between about 500 and 850 degrees C. at atmospheric pressure or in a $N_2$ environment (also under atmospheric pressure) using a RTA process for a time between about 20 and 60 seconds.

FIG. 5 shows a cross section of the two gate electrodes 12 and 14 after the photoresist mask 26 has been removed from the surface. Conventional methods of photoresist removal may be applied for this step. To remove the photoresist mask from the surface, sulfuric acid ($H_2SO_4$) and mixtures of $H_2SO_4$ with other oxidizing agents such as hydrogen peroxide ($H_2O_2$) are widely used in stripping photoresist. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

It is clear from the above highlighted processing sequence that, because of the use of a layer of silicon rich CVD oxide, no voids have been formed in the surface of layer 20 of polysilicon of gate electrode 12, thus avoiding the formation of silicon cobalt in voids in the surface of layer 20 of gate electrode 12 and therewith eliminating a major contributor to Gate Oxide Integrity failure of gate electrode 12 and of salicided CMOS devices in general.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a layer of protect oxide overlying at least one gate structure created over the surface of a substrate, comprising the steps of:

providing a substrate, at least one gate structure having been created over the surface of said substrate, said at least one gate structure comprising a layer of gate dielectric over which a layer of polysilicon forms said at least one gate structure, said layer of polysilicon comprising a top layer of said at least one gate structure, self-aligned impurity implants having been provided for said at least one gate structure, gate spacers having been provided over sidewalls of said at least one gate structure; and depositing a layer of protect oxide over the surface of said at least one gate structure, said layer of protect oxide comprising silicon rich CVD oxide having a refractive index for silicon of between about 1.57 and 1.60.

2. The method of claim 1 wherein said layer of protect oxide is deposited preferably using methods of LPCVD or CVD.

3. The method of claim 1 wherein said layer of protect oxide is deposited preferably using methods of Plasma Enhanced Chemical vapor Deposition (PECVD).

4. The method of claim 1 wherein said layer of protect oxide has a thickness preferably between about 300 and 500 Angstrom and more preferably to a thickness of about 400 Angstrom.

5. The method of claim 1 wherein said at least one gate structure comprises a MOSFET device on a silicon substrate.

6. The method of claim 5 wherein said MOSFET device has a channel length of about 0.18 $\mu$m or less.

7. The method of claim 1 wherein said substrate comprises silicon.

8. A method of saliciding contact regions of at least one semiconductor device created over the surface of a substrate, comprising the steps of:

providing a substrate, at least one first gate electrode having been created over the surface of said substrate, said at least one first gate electrode having been designated as a gate electrode needing to be provided with salicided contact surfaces to said at least one first gate electrode, at least one second gate electrode having been created over the surface of said substrate, said at least one second gate electrode having been designated as a gate electrode not needing to be provided with salicided contact surfaces to said at least one second gate electrode, said at least one first and said at least one second gate electrodes comprising a layer of gate dielectric over which a layer of polysilicon forms said at least one first and second gate electrodes, said layer of polysilicon comprising the top layer of said at least one first and said at least one second gate electrodes, self-aligned impurity implants having been provided for said at least one first and said at least one second gate electrodes, gate spacers having been provided over sidewalls of said at least one first and said at least one second gate electrodes;

depositing a layer of protect oxide over the surface of said at least one first and said at least one second gate electrodes, including exposed surface regions of said substrate, said layer of protect oxide comprising silicon rich CVD oxide having a refractive index for silicon of between about 1.57 and 1.60;

providing a photoresist mask over the surface of said layer of protect oxide, said photoresist mask shielding said at least one second gate electrode, exposing the surface of said layer of protect oxide deposited over the surface of said at least one first gate electrode;

removing said layer of protect oxide deposited over said at least one first gate electrode, exposing the surface of said at least one first gate electrode, leaving in place said layer of protect oxide overlying said at least one second gate electrode;

depositing a layer of metal over the exposed surface of said at least one first gate electrode;

annealing said layer of metal, creating a layer of metal salicide overlying contact regions to said at least one first gate electrode; and removing said photoresist mask from above the surface of said substrate, exposing the surface of said layer of protect oxide overlying said at least one second gate electrode.

9. The method of claim 8 wherein said layer of protect oxide is deposited preferably using methods of LPCVD or CVD.

10. The method of claim 8 wherein said layer of protect oxide is deposited preferably using methods of Plasma Enhanced Chemical vapor Deposition (PECVD).

11. The method of claim 8 wherein said layer of protect oxide has a thickness preferably between about 300 and 500 Angstrom and more preferably to a thickness of about 400 Angstrom.

12. The method of claim 8 wherein said at least one first gate electrode comprises a MOSFET device on a silicon substrate.

13. The method of claim 12 wherein said MOSFET device has a channel length of about 0.18 $\mu$m or less.

14. The method of claim 8 wherein said at least one second gate electrode comprises a MOSFET device on a silicon substrate.

15. The method of claim 14 wherein said MOSFET device has a channel length of about 0.18 $\mu$m or less.

16. The method of claim 8 wherein said substrate comprises silicon.

17. The method of claim 8 wherein said layer of metal deposited over the exposed surface of said at least one first gate electrode comprises cobalt.

18. The method of claim 8 wherein said annealing said layer of metal is performed at a temperature between about 500 and 850 degrees C. at atmospheric pressure or in a $N_2$ environment under atmospheric pressure, said temperature being applied for a time between about 20 and 60 seconds.

19. The method of claim 8 wherein said removing said layer of protect oxide deposited over said at least one first gate electrode comprises applying buffered HF wet etch process.

* * * * *